United States Patent
Galla et al.

(10) Patent No.: US 10,641,800 B2
(45) Date of Patent: May 5, 2020

(54) INDICATORS FOR SAFE DISCONNECTION OF ELECTRICAL CIRCUITS

(71) Applicant: Tyco Electronics Corporation, Berwyn, PA (US)

(72) Inventors: Matthew P. Galla, Holly Springs, NC (US); Harry G. Yaworski, Cary, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 125 days.

(21) Appl. No.: 14/794,047

(22) Filed: Jul. 8, 2015

(65) Prior Publication Data

US 2017/0010311 A1   Jan. 12, 2017

(51) Int. Cl.
*G01R 19/155* (2006.01)
*G08B 21/18* (2006.01)

(52) U.S. Cl.
CPC .......... *G01R 19/155* (2013.01); *G08B 21/18* (2013.01)

(58) Field of Classification Search
CPC .............................. G01R 19/155; G08B 21/18
See application file for complete search history.

(56) References Cited

U.S. PATENT DOCUMENTS

| | | | | |
|---|---|---|---|---|
| 4,814,933 A * | 3/1989 | Filter | ...................... | G01R 15/22 324/133 |
| 4,834,503 A * | 5/1989 | Tsujimoto | .............. | G03B 17/24 345/96 |
| 5,066,104 A * | 11/1991 | Mohebban | ............ | G02F 1/1313 324/501 |
| 5,515,390 A * | 5/1996 | Benton | ............... | G06F 11/0754 324/73.1 |
| 6,097,302 A * | 8/2000 | Zinzell | .................... | G09F 9/302 315/152 |
| 6,774,970 B1 * | 8/2004 | Sekiguchi | ......... | G02F 1/134327 349/142 |
| 2006/0164068 A1 | 7/2006 | Czyzewski et al. | | |
| 2008/0198277 A1 * | 8/2008 | Czyzewski | .......... | G01R 19/155 349/1 |
| 2013/0134960 A1 | 5/2013 | Govier et al. | | |
| 2016/0313386 A1 * | 10/2016 | Bugaris | ................ | G01R 19/155 |

FOREIGN PATENT DOCUMENTS

| | | |
|---|---|---|
| DE | 32 19 703 A1 | 12/1983 |
| EP | 2 746 784 A2 | 6/2014 |

OTHER PUBLICATIONS

Notification of Transmittal of the International Search Report and the Written Opinion of the International Searching Authority, or the Declaration, for corresponding Application No. PCT/US2016/040935, dated Oct. 6, 2016, 13 pages.

* cited by examiner

*Primary Examiner* — Patrick N Edouard
*Assistant Examiner* — Eboni N Giles
(74) *Attorney, Agent, or Firm* — Myers Bigel, P.A.

(57) ABSTRACT

Provided are devices for electrical connectors to provide indication that the electrical connectors are not energized. Devices include a first indicator that includes a first indication technology that is configured to provide a first visual indication corresponding to a voltage of a primary conductor and a second indicator that includes a second indication technology that is different from the first indication technology and that is configured to provide a second visual indication corresponding to the voltage of the primary conductor.

13 Claims, 9 Drawing Sheets

INDICATORS FOR SAFE DISCONNECTION OF ELECTRICAL CIRCUITS

BACKGROUND

Heavy electrical cables are commonly used in the mining industry for powering equipment, such as shovels, drills and the like. Such equipment may operate using a medium voltage electrical service, which may range from 8 kV to 35 kV. As the needs for different equipment and/or equipment locations may change, the configuration of the electrical cables may be reconfigured by adding, removing and/or moving the electrical cables. The cables may be electrically coupled using cable couplers or connectors that may be used to accomplish the changes in electrical power delivery to the equipment.

Mining couplers are adapted from other electrical market products. However, the mining industry has unique requirements, such as quick and reliable connect and disconnect, high environmental contamination and normal operation near the rated current/power levels. These requirements may differ from many electric utility applications such as underground residential distribution (URD). For example, electric utility market models of "plug and play" designs for applications such as underground residential distribution generally do not see full current loading, are in relatively clean environments and the mechanical duty requirements are relatively low compared to mining.

In contrast with low voltage applications, the connectors are characterized as being inseparable in that the electrical service must be de-energized during disconnection to avoid injury to personnel. Disconnecting electrically energized connectors can and has caused serious personal injury, which, in some cases has resulted in death. In this regard, techniques to avoid disconnecting energized (i.e., "live") connectors have been developed.

One conventional technique includes providing a test point on the connector that is capacitively charged by the electric field between the primary conductor and the grounded outer layer. This test point develops a voltage that may be tested using an elongated insulated test probe, referred to as a "hot stick", and metering equipment, to determine if the test point has a voltage. This technique has the disadvantage of requiring personnel to carry and maintain equipment to determine that the connector is not energized.

Another conventional technique for preventing an energized connector from being disconnected includes one or more special ground contacts that are in the connector and that conductively disengage before the primary voltage line is disconnected. These special ground contacts may control one or more relays at control equipment locations to disconnect the electrical power to the connector before the primary voltage line is disconnected. However, these systems can be adjusted in the field and rendered inoperable in response to nuisance trips that may reduce production activities. Accordingly, an additional level of personnel safety in disconnecting connectors is needed.

BRIEF DRAWING DESCRIPTION

The accompanying figures are included to provide a further understanding of the present invention, and are incorporated in and constitute a part of this specification. The drawings illustrate some embodiments of the present invention and, together with the description, serve to explain principles of the present invention.

Figure 12:
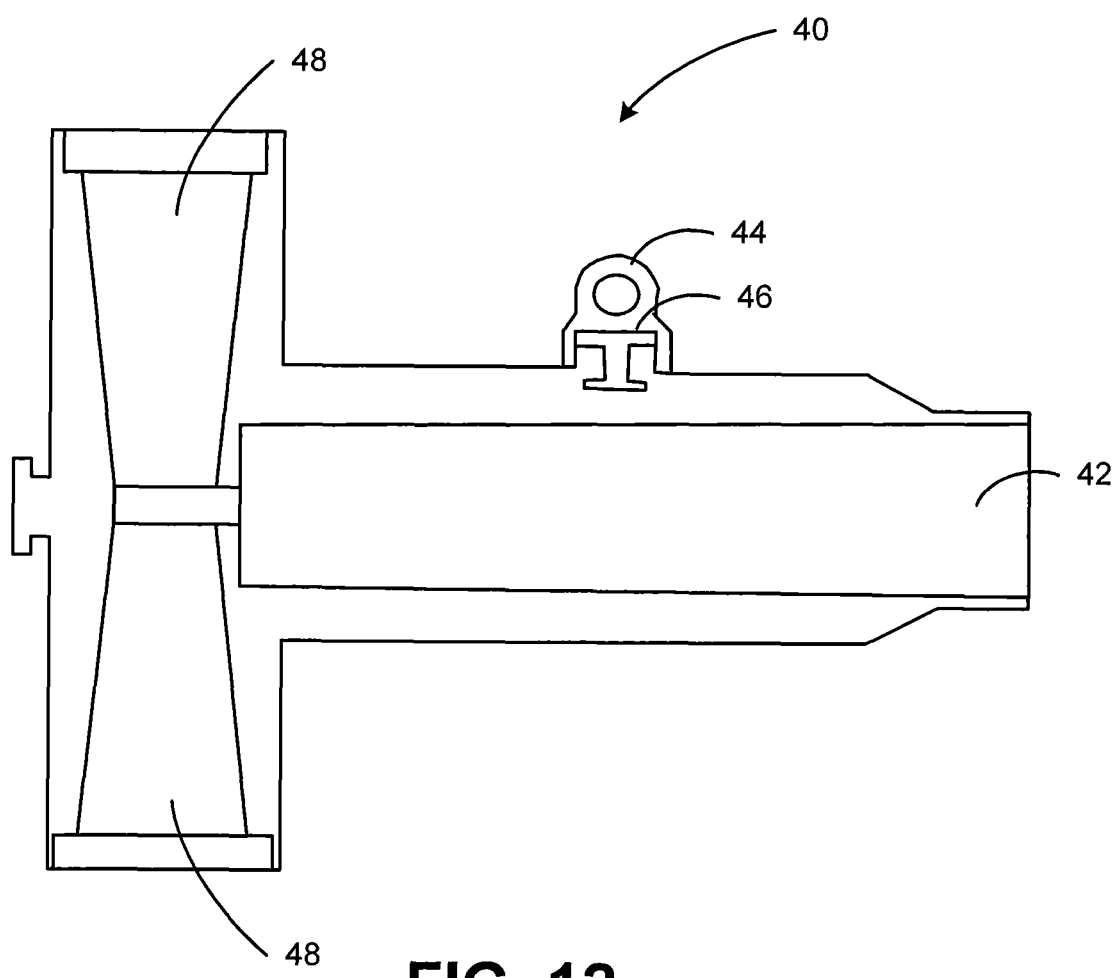

FIG. 12, which is a partial side cross-sectional schematic view of an elbow connector that may incorporate some embodiments of the present invention.

SUMMARY

Some embodiments of the present invention are directed to devices that provide indication that a connector is safe to disconnect. For example, devices for electrical connectors may include a driving circuit that is parasitically coupled to a primary conductor in the electrical connector and an indicator that includes an indication technology and that is electrically coupled to the driving circuit, the indicator being configured to provide a visual indication corresponding to a voltage of the primary conductor.

In some embodiments, the indicator includes a first indicator, the indication technology includes a first indication technology, and the visual indication includes a first visual indication. The devices may include a second indicator that includes a second indication technology and that is electrically coupled to the driving circuit, second indicator being configured to provide a second visual indication corresponding to the voltage of the primary conductor.

Some embodiments provide that the first indication technology is different from the second indication technology. In some embodiments, the first indication technology includes an illumination technology that is configured to selectively emit light responsive to the voltage of the primary conductor being at an operating voltage and the second indication technology includes an occlusion technology that is configured to selectively occlude a high visibility surface responsive to the voltage of the primary conductor being at the operating voltage.

Some embodiments provide that the first indicator includes a solid state light emitting device (LED) and the second indicator includes a liquid crystal display (LCD) and a high visibility surface that is selectively visible through the LCD.

In some embodiments, responsive to the primary conductor being operated at an operating voltage, the first indicator is configured to emit light at a wavelength corresponding to a red color and the second indicator is configured to occlude the surface that is operable to reflect light at a wavelength corresponding to a green color.

Some embodiments provide that, responsive to the primary conductor being non-energized, electrical current received by the first indicator is substantially zero such that the first indicator does not emit light and the second indicator is configured to transmit reflected light from a surface that is operable to reflect light at a wavelength corresponding to a green color.

In some embodiments, the first indicator is configured to visually indicate an energized state of the primary conductor and the second indicator is configured to visually indicate a non-energized state of the primary conductor.

Some embodiments include a user input component that is configured to receive an input from a user and provide that, in the absence of the input from the user, the first indicator provides the first visual indication corresponding to the voltage of the primary conductor and responsive to receipt of the input from the user, the second indicator provides the second visual indication corresponding to the voltage of the primary conductor. Some embodiments provide that the first indicator includes a first solid state light emitting device (LED) and the second indicator includes a second solid state light emitting device (LED). In some embodiments, the first indicator and the second indicator function in a complementary manner responsive to the input from the user and one of the first indicator or the second indicator is illuminated responsive to the voltage of the primary conductor being at the operating voltage.

Some embodiments include a third indicator that includes a third indication technology and that is electrically coupled to the driving circuit, the third indicator being configured to provide a third visual indication corresponding to the voltage of the primary conductor. Some embodiments provide that the third indication technology includes an occlusion technology that is configured to selectively occlude a high visibility surface responsive to the voltage of the primary conductor being at the operating voltage.

Some embodiments include a housing that includes a sealing material that is configured to protectively seal components of the device from environmental elements.

In some embodiments, the device is configured to be installed into an electrical connector.

Some embodiments provide that the driving circuit is capacitively coupled to the primary conductor and the indicator includes a solid state light emitter that receives an electrical current from the driving circuit when the primary conductor is energized to an operating voltage and that is configured to emit light responsive to receiving the electrical current. In some embodiments, the driving circuit includes a capacitive element that is a capacitive voltage divider between the primary conductor and a ground conductor. Some embodiments include an inductive coupling device that provides a driving current corresponding to a current in the capacitive element.

In some embodiments, the first indication technology is different from the second indication technology and the second indication technology includes an electrostatic actuated display that includes a plurality of indication pixels that are configured to align in a same orientation in the absence of the primary conductor being at an operating voltage and to oscillate from being aligned in the same orientation responsive to the primary conductor being at the operating voltage.

Some embodiments provide that the second indication technology includes an electrophoretic display that includes the plurality of indication pixels that are proximate an electrostatically charged electrode and a ground electrode that generate a static electric field that causes the plurality of indication pixels to align in the same orientation. In some embodiments, responsive to the primary conductor being at the operating voltage, a changing electric field overcomes the static electric field and causes ones of the plurality of indication pixels to oscillate from being aligned in the same orientation.

Some embodiments of the present invention include devices for electrical connectors. In some embodiments, such devices may include a first indicator that includes a first indication technology that is configured to provide a first visual indication corresponding to a voltage of a primary conductor and a second indicator that includes a second indication technology that is different from the first indication technology and that is configured to provide a second visual indication corresponding to the voltage of the primary conductor.

In some embodiments, the first indication technology includes an illumination technology that is configured to emit light responsive to the voltage of the primary conductor being at an operating voltage and the second indication technology includes an occlusion technology that is configured to occlude a high visibility surface responsive to the voltage of the primary conductor being at an operating voltage and to display the high visibility surface responsive to the primary conductor not being energized. In some embodiments, the first indicator includes a solid state light emitting device (LED), the second indicator includes a liquid crystal display (LCD) and the high visibility surface that is visible through the LCD responsive to the primary conductor not being energized.

Some embodiments include a driving circuit that is parasitically coupled to the primary conductor and that provides driving current to the first indicator and the second indicator.

Some embodiments of the present invention are directed to an electrical connector that includes a connector housing that is configured to receive an electrical cable that includes at least one electrical conductor, at least one termination conductor that is configured to be electrically conductively coupled to the at least one electrical conductor in the electrical cable and to be conductively engaged with another termination contact in another electrical connector, and an indicator device that is mounted to the connector housing. The indicator device may include a driving circuit that is parasitically coupled to the at least one electrical conductor and an indicator that is electrically coupled to the driving circuit, the indicator being configured to provide a visual indication corresponding to a voltage of the at least one electrical conductor.

In some embodiments, the electrical cable comprises a terminated cable. Some embodiments provide that the indicator comprises a first indicator that includes a first indication technology, the visual indication comprises a first visual indication, and the indicator device further comprises a second indicator that includes a second indication technology and that is electrically coupled to the driving circuit, second indicator being configured to provide a second visual indication corresponding to the voltage of the at least one electrical conductor. Some embodiments provide that the first indication technology is different from the second indication technology.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

DETAILED DESCRIPTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present invention will now be described more fully hereinafter with reference to the accompanying drawings, in which some embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Figure 1:
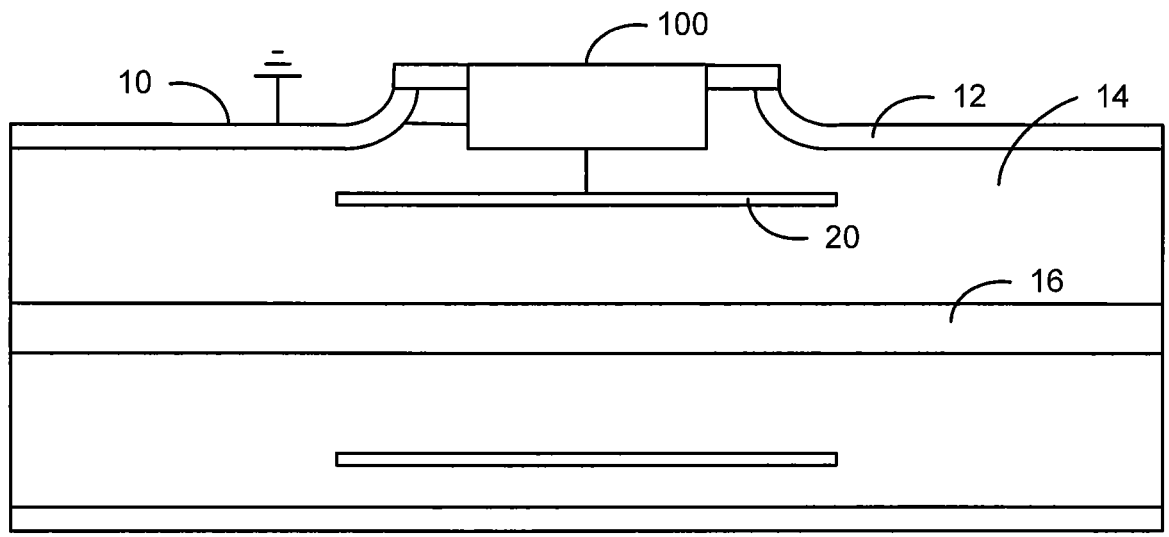
FIG. 1 is a partial side cross-sectional schematic view of a device according to some embodiments that are described herein implemented in a connector according to some embodiments of the present invention.

Reference is now made to FIG. 1, which is a partial side cross-sectional schematic view of a device according to some embodiments that are described herein implemented in a connector according to some embodiments of the present invention. As illustrated, a connector 10 may include an indicator device 100 that is configured to provide personnel with a visual indication regarding the electrical potential of the primary conductor 16. The connector 10 includes the primary conductor 16, an insulating layer 14 and a grounded layer 12. A conductive electrode 20 may be positioned in the insulating layer 14 and arranged between the primary conductor 16 and the grounded layer 12. In this manner, when the primary conductor 16 is energized to have a voltage, at an operating voltage for example, the conductive electrode 20 may be charged to a lower voltage via capacitive coupling. Thus, the indicator device 100 may be capacitively coupled to the primary conductor 16.

Some embodiments provide that the operating voltage may be in a voltage range of about 8 kV to about 35 kV. However, the invention disclosed herein may be applicable in environments operating at voltages that are less that 8 kV and voltages that are greater than 35 kV.

In some embodiments, the conductive electrode 20 may be in the form of a ring and/or elongated tube that is coaxially positioned around the primary conductor 16, however such embodiments are non-limiting as other configurations are contemplated.

The indicator device 100 may be electrically conductively coupled to the conductive electrode 20 and the grounded layer 12. In this manner, when the primary conductor 16 is energized to an operating voltage, the indicator device 100 may be driven by the electrical energy corresponding to the charged conductive electrode 20.

Figure 2:
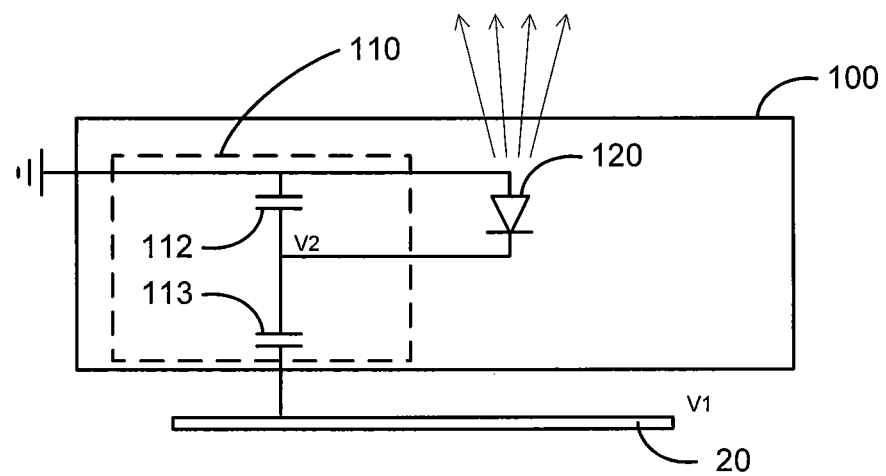
FIG. 2 is an electrical schematic diagram illustrating an indicator including a light emitting device according to some embodiments of the present invention.

Reference is now made to FIG. 2, which is an electrical schematic diagram illustrating an indicator device 100 including a light emitting device according to some embodiments of the present invention. The indicator device 100 may include a driving circuit 110 and an indicator 120. The driving circuit 110 may be parasitically coupled to the primary conductor 16 in the electrical connector via the conductive electrode 20. Some embodiments provide that the voltage V1 at the conductive electrode 20 may be higher than is practical for indicator technologies. In this regard, the driving circuit 110 may include a capacitive voltage divider that may include two or more capacitors 112, 113 arranged in series between the conductive electrode 20 and electrical ground. The voltage V2 at a node between ones of the capacitors 112, 113 may be reduced from the voltage V1. For example, in some embodiments, a voltage V1 may be about 1 kV and a voltage V2 may be about 5V. These values are merely for example and the disclosure herein contemplates values of V1 and V2 that are greater than and/or less than the example values.

The indicator 120 may be electrically coupled to the driving circuit 110 and is configured to provide a visual indication corresponding to a voltage of the primary conductor 16. For example, responsive to the primary conductor 16 being at an operating voltage, the conductive electrode 20 may be charged and supply a current to the driving circuit 110. The driving circuit 110 may provide current to the indicator 120, which may illuminate responsive thereto. In this manner, personnel may see the illuminated indicator 120, which indicates that the primary conductor 16 is energized, and realize that disconnecting the connector 10 may be unsafe until the primary conductor is de-energized. Thus, the indicator device 100 may provide indication regarding whether the connector may be safely disconnected.

Figure 3:
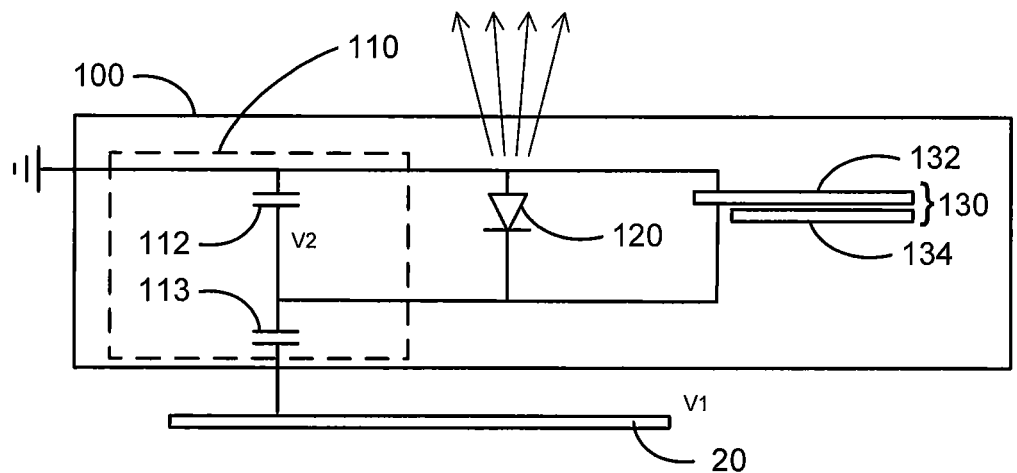
FIG. 3 is an electrical schematic diagram illustrating an indicator including a light emitting device and an occlusion technology according to some embodiments of the present invention.

Reference is now made to FIG. 3, which is an electrical schematic diagram illustrating an indicator device including a light emitting device and an occlusion technology according to some embodiments of the present invention. As used herein, the term occlusion refers to visual occlusion in that an occlusion technology may be configured to selectively prevent or allow light to be transmitted therethrough. Some elements illustrated in FIG. 3 are described above regarding FIG. 2 and thus will not be repeated for brevity. In some embodiments, the indicator device 100 includes a first indicator 120 that uses a first indication technology and a second indicator 130 that includes a second indication technology. Each of the first and second indicators 120, 130 may be electrically coupled to the driving circuit 110 and each be configured to provide a visual indication corresponding to the voltage of the primary conductor 16.

As discussed above regarding FIG. 3, the first indicator 120 may be an illumination technology that is configured to selectively emit light responsive to the voltage of the primary conductor 16 being at an operating voltage. Some embodiments provide that the second indication technology includes an occlusion device 132 that is configured to selectively occlude a high visibility surface 134 responsive to the voltage of the primary conductor 16 being at the operating voltage. In some embodiments, the second indicator 130 comprises a liquid crystal display (LCD) 132 and a high visibility surface 134 that is selectively visible through the LCD 132. In some embodiments, the high visibility surface 134 may be a high contrast surface that includes a color or other visual feature that provides a visual contrast relative to the surrounding structures and/or environment.

In use and operation, the responsive to the primary conductor 16 being operated at an operating voltage, the first indicator 120 is configured to emit light at a wavelength corresponding to, for example, a red color, and the occlusion device 132 of the second indicator 130 is configured to occlude the high visibility surface 134 that is operable to reflect light at a wavelength corresponding to, for example, a green color. Some embodiments provide that, responsive to the primary conductor 16 being non-energized, electrical current received by the first indicator 120 is substantially zero such that the first indicator 120 does not emit light and the occlusion device 132 of second indicator 130 is configured to transmit reflected light from the high visibility surface 134 that is operable to reflect the green light. Thus, the first indicator 120 is configured to visually indicate an energized state of the primary conductor 16 and the second indicator 130 is configured to visually indicate a non-energized state of the primary conductor 16. In this manner, in the event that a failure occurs in the first indicator 120 that might incorrectly indicate that the primary conductor 16 is de-energized, the occlusion technology of the second indicator 130 may provide a contrary indication and personnel may be alerted to unsafe disconnection conditions.

Figure 4:
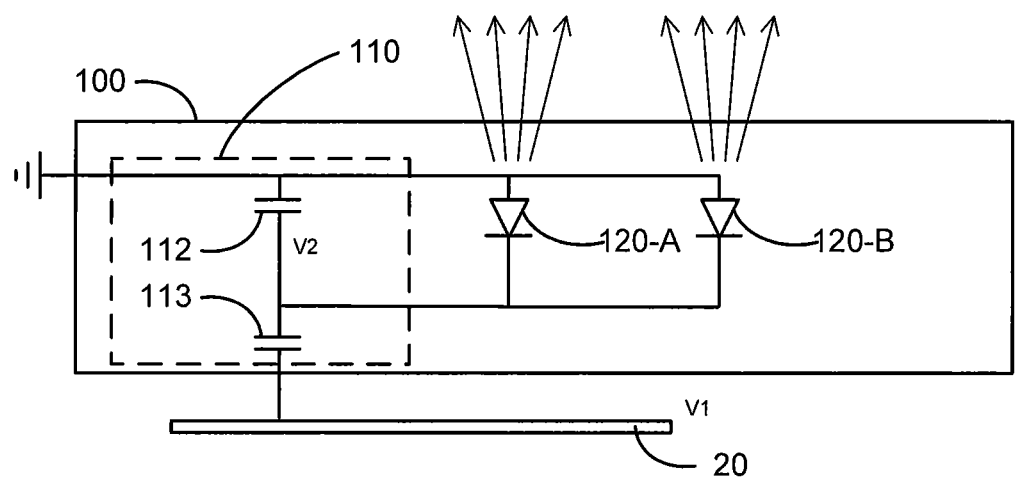
FIG. 4 is an electrical schematic diagram illustrating an indicator including a plurality of light emitting devices according to some embodiments of the present invention.

Brief reference is now made to FIG. 4, which is an electrical schematic diagram illustrating an indicator device including a plurality of light emitting devices according to some embodiments of the present invention. Some elements illustrated in FIG. 4 are described above regarding FIG. 2 and thus will not be repeated for brevity. In some embodiments, the indicator 120 may include multiple indicators 120A, 120B that may operate in the same fashion. Such redundancy may provide protection against one of the indicators 120A, 120B failing and providing no indication that the primary conductor 16 is energized. Further, although not illustrated, some embodiments provide that the indicator device 100 includes first and second driving circuits that are operable to redundantly and separately drive the indicators 120A and 120B.

Figure 5A:
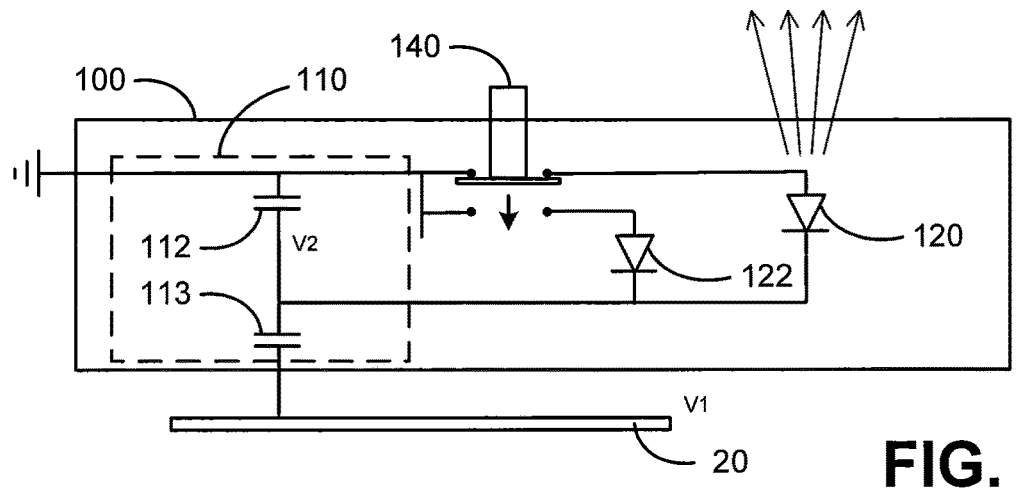
FIGS. 5A and 5B are electrical schematic diagrams illustrating an indicator in two different respective states including a plurality of light emitting devices according to some embodiments of the present invention.
Figure 5B:
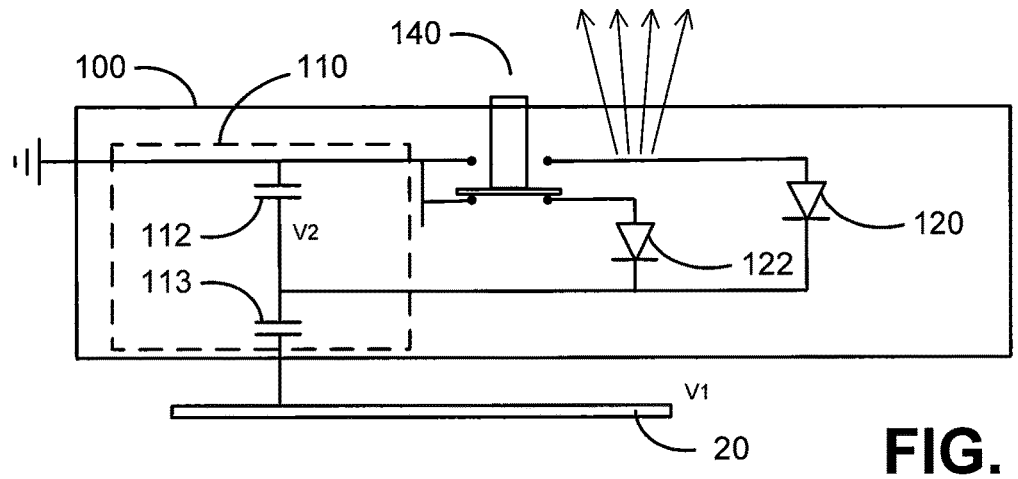

Reference is now made to FIGS. 5A and 5B, which are electrical schematic diagrams illustrating an indicator device including a plurality of light emitting devices according to some embodiments of the present invention. Some embodiments include a first indicator 120 and a second indicator 122 that may operate in a complementary manner relative to one another. Some embodiments include a user input component 140 that is configured to receive an input from a user. Some embodiments provide that the user input component 140 includes a switch, a button, a relay, and/or other technologies that convert a user action into an electrical switching operation. Referring to FIG. 5A, the user input 140 is illustrated in the non-actuated or default position in which an input is not being received from the user. As illustrated, in the absence of the input from the user, the first indicator 120 provides the first visual indication corresponding to the voltage of the primary conductor 16.

Referring to FIG. 5B, the user input 140 is illustrated in the actuated position in which an input is being received from the user. As illustrated, responsive to receipt of the input from the user, the second indicator 122 provides the second visual indication corresponding to the presence of voltage on the primary conductor 16 and the first indicator ceases to provide the first visual indication. In the event that the primary conductor 16 is de-energized, then neither of the first and second indicators 120, 122 will be illuminated, regardless of the state of the user input 140. Some embodiments provide that the first indicator 120 and the second indicator 122 comprise solid state light emitting devices. Although LEDs may typically be characterized as having a long service life, such as tens of thousands of hours, these service life estimates may be based on statistical measures in which individual LEDs may still fail prematurely. In this manner, the redundancy of having a selectively operated second indicator 122, may indicate that the primary conductor 16 is at an operating voltage, even if the first indicator 120 has failed. Additionally, since the second indicator 122 may be typically in an off state in the default position, the service life thereof may be significantly prolonged.

Some embodiments provide that, in addition to the first indicator 120 and the second indicator 122, the indicator device 100 may include a third indicator that is electrically coupled to the driving circuit 110 and that provides a third visual indication corresponding to the voltage of the primary conductor 16. In some embodiments, the third indicator includes an occlusion technology, as discussed above, regarding FIG. 3, that is configured to selectively occlude a high visibility surface responsive to the voltage of the primary conductor 16 being at the operating voltage. The combination of the occlusion technology of the third indicator with the complementary functionality of the first and second indicators provides additional redundancy in indicating that the primary conductor 16 is at an operating voltage and thus should not be disconnected.

Figure 6:
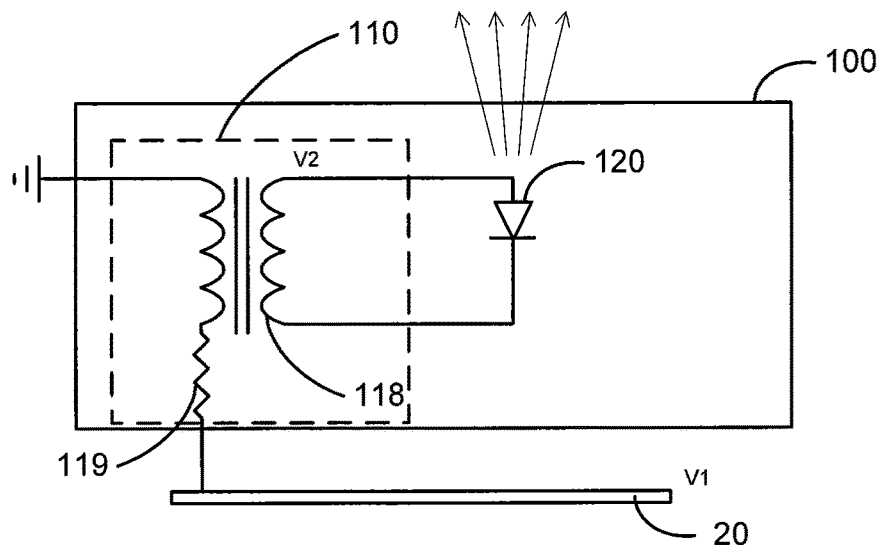
FIG. 6 is an electrical schematic diagram illustrating an indicator according to some embodiments of the present invention.

Brief reference is now made to FIG. 6, which is an electrical schematic diagram illustrating an indicator device according to some embodiments of the present invention. The indicator device 100 according to FIG. 6 is similar to the indicator device 100 as discussed above regarding FIG. 2, except that instead of the capacitive voltage divider, indicator device 100 according to FIG. 6 includes an inductive coupling device 118 that provides a driving current corresponding to a current in the capacitive element 20. For example, as the capacitive element 20 is charged, electrical current flows through a resistor 119 and a primary coil of the inductive coupling device 118. In some embodiments, the inductive coupling device 118 may include for example, an electrical transformer that may convert the first voltage applied to the primary coil into a second voltage V2 across the secondary coil via inductive coupling. In this manner an electrical current may be generated across the indicator 120. Although discussed in the context of a single indicator 120, the inductive coupling device 118 may be combined with other embodiments disposed herein using one or more indicators and/or indicator types.

Although not illustrated, one or more of the components included in the indicator device 100 may be provided in a housing that includes a sealing material that is configured to protectively seal components of the indicator device 100 from environmental elements. In some embodiments, the indicator device 100 may be modular and thus configured to be installed into existing electrical connectors. In some embodiments, electrical connectors may be manufactured with one or more of the components included in the indicator device 100 integrally provided therein.

Figure 7A:
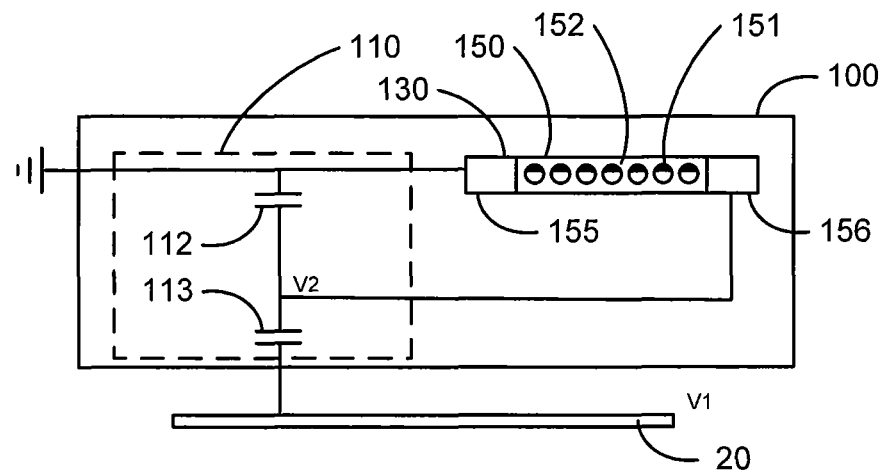
FIGS. 7A-7B are schematic diagrams illustrating visual indications of an indicator device according to some embodiments of the present invention.
Figure 7B:
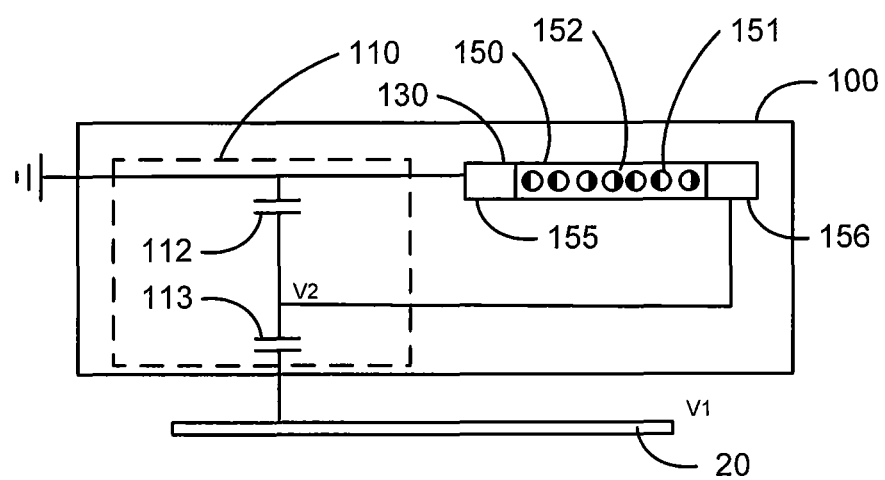

Reference is now made to FIGS. 7A-7B, which are schematic diagrams illustrating an indicator device in different states, respectively, according to some embodiments of the present invention. Some elements illustrated in FIGS. 7A-7B are described above regarding FIG. 2 and thus will not be repeated for brevity. Although only the second indicator device 130 is illustrated in FIGS. 7A-7B, embodiments herein may include any one or more other indication technologies disclosed herein in combination with the second indicator device of FIGS. 7A-7B. In some embodiments, the second indication technology comprises an electrostatic actuated display 150 that includes at least one indication pixel 151. Although illustrated as multiple indication pixels 151 in the figures, embodiments herein are not so limited. For example, a single patch of electrostatically actuated pigment may be used as a single pixel 151. Some embodiments provide that, although the patch may include multiple pigment droplets, the patch may be considered as a single pixel and/or independently addressable zone.

The indication pixels 151 may be suspended in a fluid 152. Some embodiments provide that the fluid 152 may include a viscosity that controls a rate of change of the position of the indication pixels 151. The electrostatic actuated display 150 may include conductive electrodes 155, 156 that sandwich the display 150. In some embodiments, the fluid 152 and/or one of the conductive electrodes 155, 156 may include a material that includes and/or causes a static charge therein.

Referring to FIG. 7A, which illustrates a state of the indicator 130 when the primary conductor is not at an operating voltage, voltage V1 is about zero and thus voltage V2 is about zero. In the absence of a changing electric field due to alternating current, the small static electric field resulting from the charged material cause the pixel pigment elements 151 to align in the same orientation. In this manner, in the absence of any AC power, the pixel pigment elements 151 all show the same color, such as a fluorescent green, for example. Although not illustrated, different zones of the pixel pigment elements 151 may be colored differently such that, when all of the pixel pigment elements 151 are aligned, an image or other graphic is displayed. An example may include pixel pigment elements 151 that, when aligned, display the letters SAFE in bright green against a contrasting background, such as, for example, white. In some embodiments, individual pigment droplets that are configured to all operated based on a single input may be referred to as pixel pigment elements 151, even to the extent that the individual ones of the multiple pixel pigment elements 151 are configured to operate in concert with one another based on the single input.

Referring to FIG. 7B, which illustrates a state of the indicator 130 when the primary conductor is at an operating voltage, voltage V1 may be about 1 kV. An alternating electric field may be generated based on the alternating voltage level of electrode 156 relative to electrode 155. The alternating electric field may be significantly stronger than the small static electric field and thus, responsive to alternating electric field, the positions of the pixel pigment elements 151 change from the aligned state. In this manner, the pixel pigment elements 151 may no longer provide a visual indication corresponding to a de-energized condition.

Although illustrated with the conductive electrode 156 as being charged by the voltage V2, some embodiments provide that the alternating electric field may be generated by the operating voltage of the primary conductor. Additionally, although illustrated as electrodes on sides of the electrostatic actuated display 150, the electrodes 155 and/or 156 may be on a top and bottom of the display 150.

Some embodiments provide that the sandwich structure of an electrostatic display may be used as the voltage source, due to the geometric and dielectric decay of the voltage level with the distance away from the primary conductor through the insulating material of the display. For example, when AC voltage is present, the pixel pigment elements inside an electrophoretic display may oscillate at 50-60 Hz, yielding alternating pigments, which would be mixed via human visual perception. Some embodiments provide that the reaction time of the pigments may be less than about 50-60 Hz such that the pigments of the pixel would become confused and provide a mixture throughout the display. In some embodiments, an electrostatically stable layer may return the display to a given state, such as light, dark, and/or colored.

In some other embodiments, the pixel pigment elements 151 may include multiple individual pigment droplets that may be considered as a single pixel. In some embodiments, the pixel pigment elements 151 may each be a solid structures including curved and/or planar outer surfaces. Some embodiments provide that an indicator may include multiple pixels, each including multiple pixel pigment elements 151, that are viewable from different viewing angles.

Figure 8A:
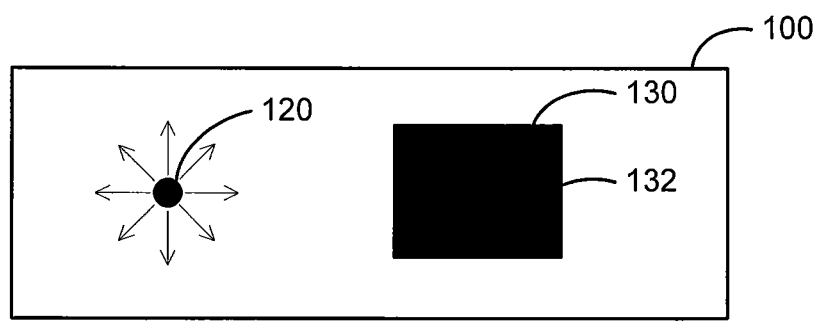
FIGS. 8A-8C are schematic diagrams illustrating visual indications of an indicator device according to some embodiments of the present invention.
Figure 8B:
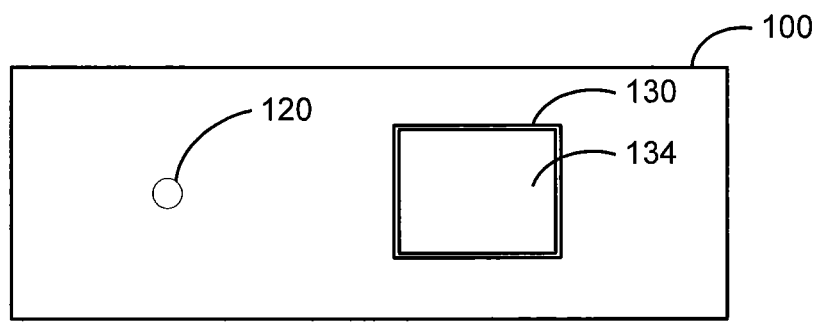
Figure 8C:
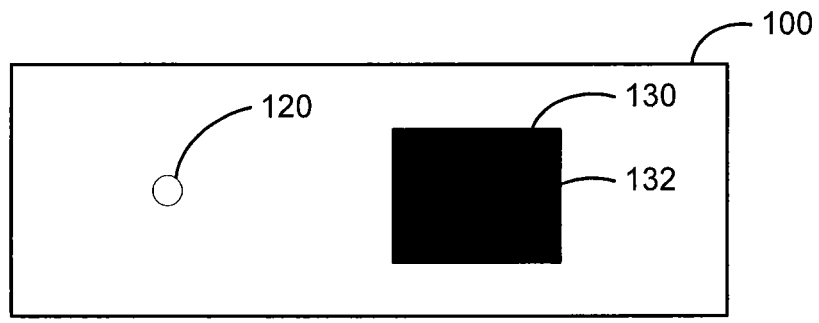

Reference is now made to FIGS. 8A-8C, which are schematic diagrams illustrating visual indications of an indicator device according to some embodiments of the present invention. The indicators in the indicator device of FIGS. 8A-8C may correspond to embodiments discussed above regarding FIG. 3. Referring to FIG. 8A, which illustrates the visual indications corresponding to the primary conductor 16 being at an operating voltage, the first indicator 120 may include a light emitting device that is driven by the driving circuit 110 when the primary conductor 16 is at the operating voltage. Additionally, the second indicator 130 may include an occlusion technology 132, such as LCD, that is substantially dark and occludes a high visibility surface when the primary conductor 16 is at the operating voltage.

Referring to FIG. 8B, which illustrates the visual indications corresponding to the primary conductor 16 being de-energized, the first indicator 120 does not emit light and the second indicator 130 is not occluding the high visibility surface 134. As such, the first indicator 120, which may be characterized as indicating that the primary conductor 16 is energized, is not providing a visual indication. In contrast, the second indicator 130, which may be characterized as indicating that the primary conductor 16 is de-energized, is providing a visual indication.

Referring to FIG. 8C, which illustrates the visual indications corresponding to the primary conductor 16 being energized and the first indicator 120 failing to indicate this condition. In a circumstance where the first indicator 120 fails to indicate the presence of an operating voltage at the primary conductor 16, the occlusion technology of the second indicator 130 provides an additional indication that the primary conductor 16 is energized. In this regard, even with the failure of the first indicator 120, personnel may be visually notified that the primary conductor 16 is at an operating voltage.

Figure 9A:
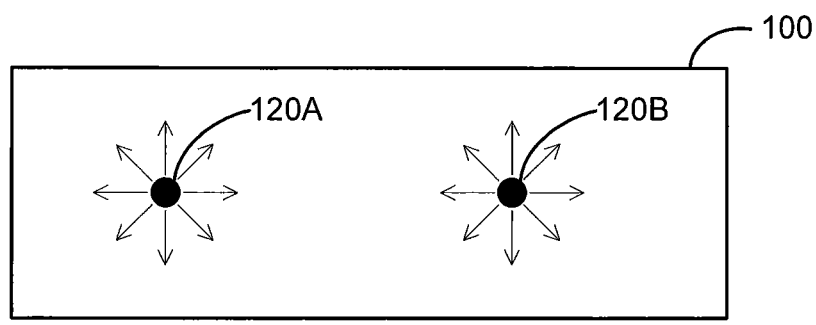
FIGS. 9A-9C are schematic diagrams illustrating visual indications of an indicator device according to some embodiments of the present invention.
Figure 9B:
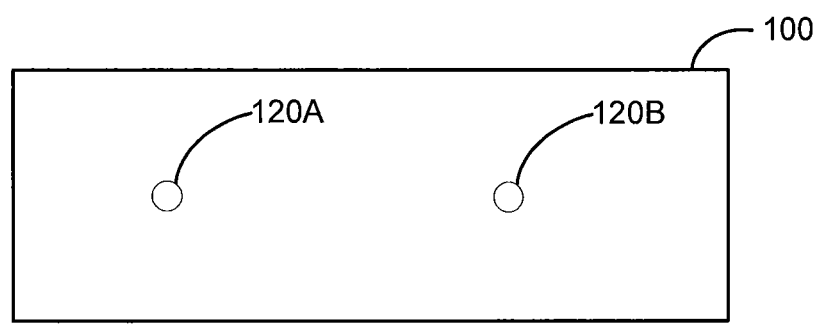
Figure 9C:
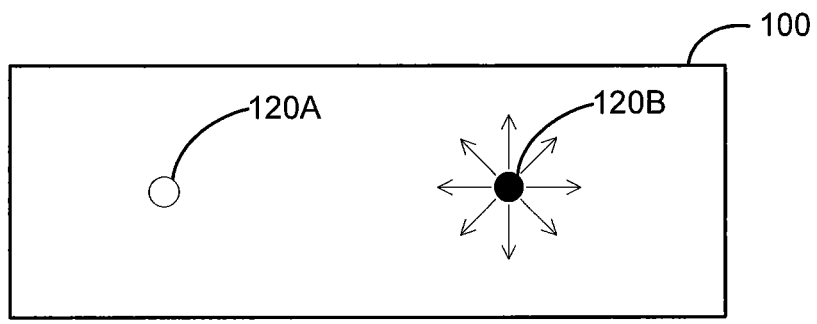

Reference is now made to FIGS. 9A-9C, which are schematic diagrams illustrating visual indications of an indicator device according to some embodiments of the present invention. The indicators in the indicator device of FIGS. 9A-9C may correspond to embodiments discussed above regarding FIG. 4. Referring to FIG. 9A, which illustrates the visual indications corresponding to the primary conductor 16 being at an operating voltage, the first and second indicators 120A, 120B may each include a light emitting device that is driven by the driving circuit 110 when the primary conductor 16 is at the operating voltage.

Referring to FIG. 9B, which illustrates the visual indications corresponding to the primary conductor 16 being de-energized, the first and second indicators 120A, 120B do not emit light.

Referring to FIG. 9C, which illustrates the visual indications corresponding to the primary conductor 16 being energized and the first indicator 120A failing to indicate this condition. In a circumstance where the first indicator 120A fails to indicate the presence of an operating voltage at the primary conductor 16, the second indicator 120B provides an additional indication that the primary conductor 16 is energized. In this regard, even with the failure of the first indicator 120A, personnel may be visually notified that the primary conductor 16 is at an operating voltage based on the second indicator 120B.

Figure 10A:
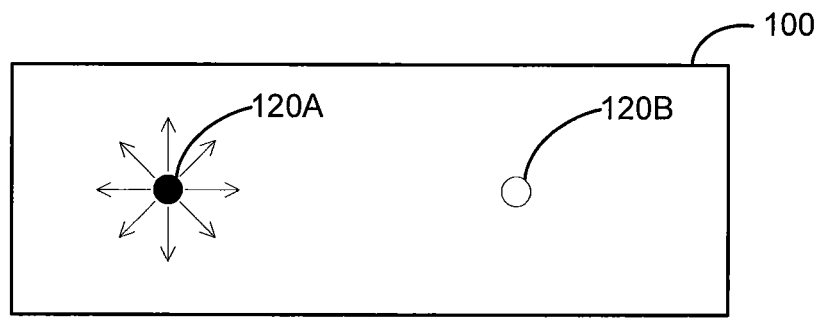
FIGS. 10A-10C are schematic diagrams illustrating visual indications of an indicator according to some embodiments of the present invention.
Figure 10B:
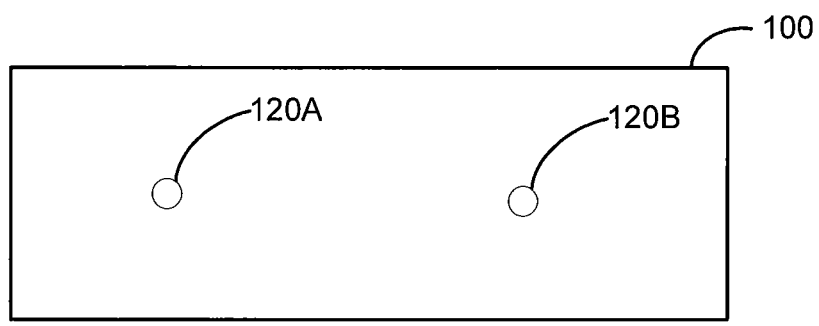
Figure 10C:
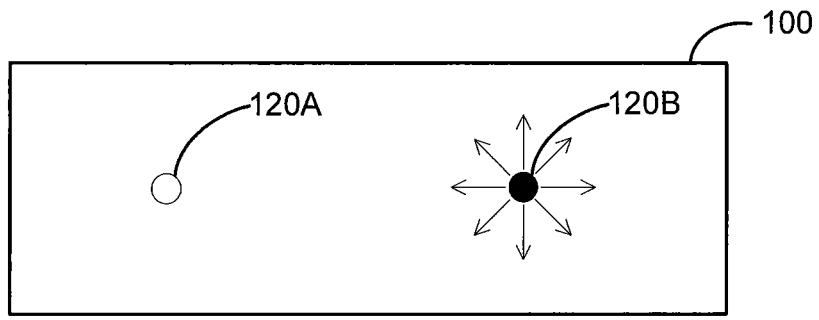

Reference is now made to FIGS. 10A-10C, which are schematic diagrams illustrating visual indications of an indicator device according to some embodiments of the present invention. The indicators in the indicator device of FIGS. 10A-10C may correspond to embodiments discussed above regarding FIG. 5. Referring to FIG. 10A, which illustrates the visual indications corresponding to the primary conductor 16 being at an operating voltage, the first and second indicators 120A, 120B may each include a light emitting device that is selectively driven by the driving circuit 110 when the primary conductor 16 is at an operating voltage. As illustrated, the first and second indicators 120A and 120B may operate in a complementary fashion relative to one another. For example as illustrated in FIG. 10A, the first indicator 120A is illuminated in the absence of activation of a user input 140 and the second indicator 120B is not illuminated.

Referring to FIG. 10B, which illustrates the visual indications corresponding to the primary conductor 16 being de-energized, the first and second indicators 120A, 120B do not emit light, regardless of the state of the user input 140. Thus, to ensure that the primary conductor 16 is not an operating voltage, personnel may observe the indicator device 100 before and after the user input 140 is actuated.

Referring to FIG. 10C, which illustrates the visual indications corresponding to the primary conductor 16 being energized, the first indicator 120A failing to indicate this condition and the user input 140 being actuated. In a circumstance where the first indicator 120A fails to indicate the presence of an operating voltage at the primary conductor 16, the second indicator 120B selectively provides an indication that the primary conductor 16 is energized responsive to the user input 140. In this regard, even with the failure of the first indicator 120A, personnel may be visually notified that the primary conductor 16 is at an operating voltage based on the second indicator 120B.

Figure 11A:
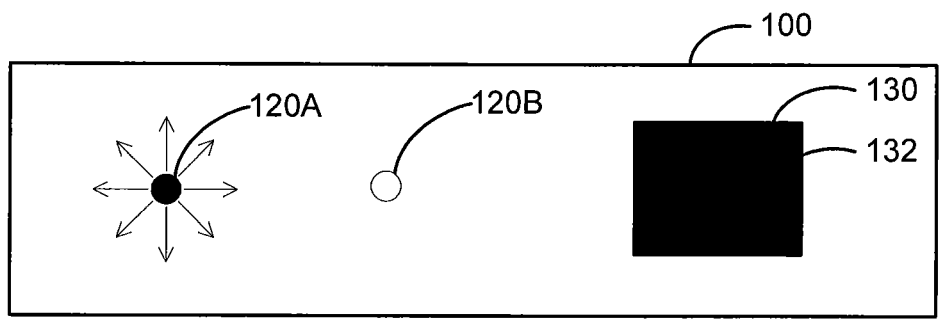
FIGS. 11A-11C are schematic diagrams illustrating visual indications of an indicator according to some embodiments of the present invention.
Figure 11B:
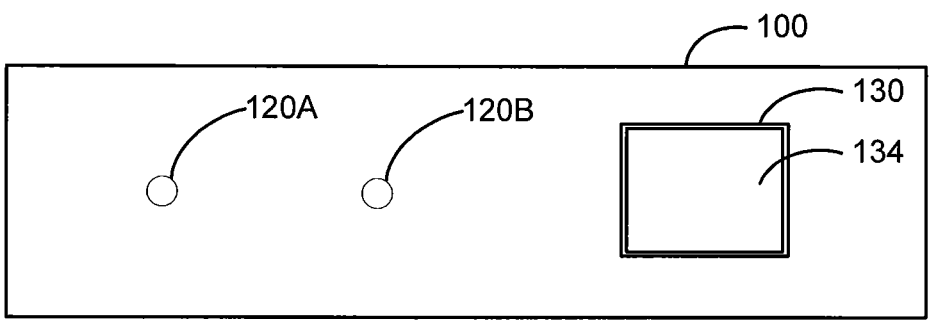
Figure 11C:
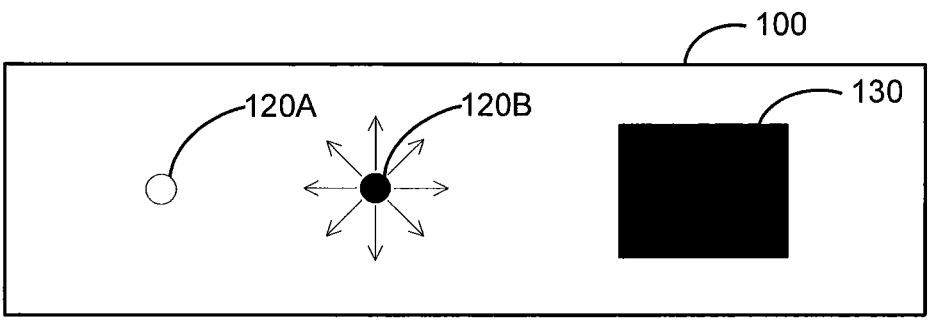

Reference is now made to FIGS. 11A-11C, which are schematic diagrams illustrating visual indications of an indicator according to some embodiments of the present invention. The indicators in the indicator device of FIGS. 11A-11C may correspond to embodiments discussed above regarding FIGS. 3 and 5. Referring to FIG. 11A, which illustrates the visual indications corresponding to the primary conductor 16 being at an operating voltage, the first and second indicators 120A, 120B may each include a light emitting device that is selectively driven by the driving circuit 110 when the primary conductor 16. As illustrated, the first and second indicators 120A and 120B may operate in a complementary fashion relative to one another. For example as illustrated in FIG. 11A, the first indicator 120A is illuminated in the absence of activation of a user input 140 and the second indicator 120B is not illuminated. Additionally, the third indicator 130 may include an occlusion technology 132, such as LCD, that is substantially dark and occludes a high visibility surface when the primary conductor 16 is at the operating voltage.

Referring to FIG. 11B, which illustrates the visual indications corresponding to the primary conductor 16 being de-energized, the first and second indicators 120A, 120B do not emit light, regardless of the state of the user input 140. Additionally, the third indicator 130 is not occluding the high visibility surface 134. As such, the first indicator and second indicators 120A and 120B, which may be characterized as indicating that the primary conductor 16 is energized, are not providing a visual indication. In contrast, the third indicator 130, which may be characterized as indicating that the primary conductor 16 is de-energized, is providing a visual indication, namely, the high visibility surface 134. Although discussed herein as being a green color, the high visibility surface 134 may be colored any bright, highly visible color, including fluorescent colors such as green, red, white, and/or pink, among others. In some embodiments, the high visibility service 134 may include a pattern of one or more highly visible colors. In this regard, even with the failure of the first indicator 120A, personnel may be visually notified that the primary conductor 16 is at an operating voltage based on the second indicator 120B and the third indicator 130.

Referring to FIG. 11C, which illustrates the visual indications corresponding to the primary conductor 16 being energized, the first indicator 120A failing to indicate this condition and the user input 140 being actuated. In a circumstance where the first indicator 120A fails to indicate the presence of an operating voltage at the primary conductor 16, the second indicator 120B selectively provides an indication that the primary conductor 16 is energized responsive to the user input 140. Additionally, the occlusion technology of the third indicator 130 provides an additional indication that the primary conductor 16 is energized. In this regard, even with the failure of the first indicator 120A, personnel may be visually notified that the primary conductor 16 is at an operating voltage via the second indicator 120B and the third indicator 130.

Reference is now made to FIG. 12, which is a partial side cross-sectional schematic view of an elbow connector that may incorporate some embodiments of the present invention. As illustrated, an elbow connector 40 may include a cavity 42 that is configured to receive a cable having a primary conductor as described herein. The elbow connector 40 may include a test point cap 44 that is configured to be removed to access a test point 46, which may be probed using appropriate equipment to determine the voltage presence on the primary conductor. In some embodiments, the test point cap and the test point 46 may be replaced using an indicator device 100 according to one or more embodiments as disclosed herein. The elbow connector 40 may include opening 48 that are configured to receive contacts from a transformer or other equipment and/or an insulated plug.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

That which is claimed:

1. An electrical connector, comprising:
   a connector housing that is configured to receive an electrical cable that includes at least one electrical conductor;
   at least one termination conductor that is configured to be electrically conductively coupled to the at least one electrical conductor in the electrical cable and to be conductively engaged with another termination contact in another electrical connector;
   an indicator device that is mounted to the connector housing, wherein the indicator device comprises:
      a driving circuit that is capacitively coupled to the at least one electrical conductor;
      a first indicator that is electrically coupled to the driving circuit, the first indicator comprising a solid state light emitter that receives an electrical current from the driving circuit when the at least one electrical conductor is energized to an operating voltage and that is configured to emit light responsive to receiving the electrical current;
      a second indicator electrically coupled to the driving circuit, the second indicator comprising a high visibility surface and an occlusion device that is configured to selectively allow light reflected from the high visibility surface to travel through the occlusion device responsive to the voltage of the at least one electrical conductor at the operating voltage being absent from the at least one electrical conductor, wherein the high visibility surface is selectively visible through the occlusion device,
   wherein the driving circuit comprises a capacitive voltage divider between the at least one electrical conductor and a ground conductor, wherein the capacitive voltage divider comprises two or more capacitors arranged in series between the at least one electrical conductor and the ground conductor, wherein the capacitive voltage divider is configured to provide a reduced voltage to the first and second indicators.

2. The electrical connector according to claim 1, wherein the electrical cable comprises a terminated cable.

3. The electrical connector according to claim 1,
   wherein the occlusion device is configured to prevent light from being transmitted through the occlusion device such that the high visibility surface is not visible through the occlusion device, responsive to the at least one electrical conductor being energized, and
   wherein the occlusion device is configured to allow light to be transmitted through the occlusion device such that the high visibility surface is visible through the occlusion device, responsive to the voltage of the at least one electrical conductor being non-energized.

4. A device for an electrical connector, the device comprising:
   a driving circuit that is capacitively coupled to a primary conductor in the electrical connector;
   a first indicator that is electrically coupled to the driving circuit, the first indicator comprising a solid state light emitter that receives an electrical current from the driving circuit when the primary conductor is energized to an operating voltage and that is configured to emit light responsive to receiving the electrical current; and
   a second indicator electrically coupled to the driving circuit, the second indicator comprising a high visibility surface and an occlusion device that is configured to selectively allow light reflected from the high visibility surface to travel through the occlusion device responsive to the voltage of the primary conductor at the operating voltage being absent from the primary conductor, wherein the high visibility surface is selectively visible through the occlusion device,
   wherein the driving circuit comprises a capacitive voltage divider between the primary conductor and a ground conductor, wherein the capacitive voltage divider comprises two or more capacitors arranged in series between the primary conductor and the ground conductor, wherein the capacitive voltage divider is configured to provide a reduced voltage to the first and second indicators.

5. The device according to claim 4,
   wherein the first indicator is configured to emit light at a wavelength corresponding to a red color, and wherein the high visibility surface is configured to reflect light at a wavelength corresponding to a green color.

6. The device according to claim 4, further comprising a housing that includes a sealing material that is configured to protectively seal components of the device from environmental elements.

7. The device according to claim 4, further comprising an inductive coupling device that provides a driving current corresponding to a current in a capacitive element.

8. The device according to claim 4,
   wherein the occlusion device is configured to prevent light from being transmitted through the occlusion device such that the high visibility surface is not visible through the occlusion device, responsive to the primary conductor being energized, and
   wherein the occlusion device is configured to allow light to be transmitted through the occlusion device such that the high visibility surface is visible through the occlusion device, responsive to the primary conductor being non-energized.

9. The device according to claim 4, wherein the first indicator comprises a solid state light emitting device (LED), and wherein the second indicator comprises a liquid crystal display (LCD), and wherein the high visibility surface is selectively occluded by the LCD responsive to the voltage of the primary conductor being at the operating voltage.

10. The device according to claim 4, wherein, responsive to the primary conductor being non-energized, electrical current received by the first indicator is substantially zero such that the first indicator does not emit light and the occlusion device allows the high visibility surface to reflect light at a wavelength corresponding to a green color.

11. The device according to claim 4, wherein the first indicator is configured to visually indicate an energized state of the primary conductor and the second indicator is configured to visually indicate a non-energized state of the primary conductor.

12. The device according to claim 4, the device further comprising a user input component that is configured to receive an input from a user,
   wherein in the absence of the input from the user, the first indicator is configured to emit light responsive to the voltage of the primary conductor being at the operating voltage, and
   wherein responsive to receipt of the input from the user, the occlusion device is configured to occlude the high visibility surface responsive to the voltage of the primary conductor being at the operating voltage.

13. The device according to claim 4, wherein the device is configured to be installed into the electrical connector.

* * * * *